United States Patent [19]
Smayling et al.

[11] Patent Number: 5,266,517
[45] Date of Patent: Nov. 30, 1993

[54] METHOD FOR FORMING A SEALED INTERFACE ON A SEMICONDUCTOR DEVICE

[75] Inventors: Michael C. Smayling, Missouri City; Jack Reynolds, Dallas, both of Tex.

[73] Assignee: Texas Instruments Incorporated, Dallas, Tex.

[21] Appl. No.: 809,359

[22] Filed: Dec. 17, 1991

[51] Int. Cl.⁵ .......................................... H01L 21/20
[52] U.S. Cl. ...................................... 437/89; 437/83; 437/193; 437/195; 437/228
[58] Field of Search ................. 437/89, 41, 91, 92, 437/228; 257/141, 134

[56] References Cited
U.S. PATENT DOCUMENTS 4,101,350  7/1978  Possley et al. ............... 148/175
4,944,836  7/1990  Beyer et al. .................. 156/645
4,952,526  8/1990  Pribat et al. ................. 437/89
4,965,219  10/1990  Cerofolini ..................... 437/40
5,124,276  6/1992  Samata et al. ................. 437/89

Primary Examiner—Olik Chaudhuri
Assistant Examiner—H. Jey Tsai
Attorney, Agent, or Firm—Ira S. Matsil; James C. Kesterson; Richard L. Donaldson

[57] ABSTRACT

According to the invention, a semiconductor device is provided at the face of a substrate. A layer of insulator is formed adjacent the face of substrate, layer of insulator having a window disposed therethrough. A region of epitaxially semiconductor is disposed in window informs an interface with adjacent portions of layer of insulator. A seal is provided at interface of the region of epitaxial semiconductor and the layer of insulator.

35 Claims, 5 Drawing Sheets

METHOD FOR FORMING A SEALED INTERFACE ON A SEMICONDUCTOR DEVICE (C) Copyright, *M* Texas Instruments Incorporated, 1990. A portion of the Disclosure of this patent document contains material which is subject to copyright protection. The copyright and mask work owner has no objection to facsimile reproduction by anyone of the patent document or the patent disclosure, as it appears in the U. S. Patent and Trademark Office, patent file or records, but otherwise reserves all rights in its copyright and mask work whatsoever.

TECHNICAL FIELD OF THE INVENTION

The present invention relates in general to semiconductor devices, systems and methods.

BACKGROUND OF THE INVENTION

One useful semiconductor fabrication technique uses crystalline silicon epitaxially grown within a window through an insulator layer disposed across the face of a substrate. This epitaxially grown crystalline silicon is often referred to generically as "epi-fill". The "epi-fill" technique has been used with some success to fabricate transistors and in particular vertical bipolar transistors. For example, during the formation of the collector and base of a vertical npn bipolar transistor, a layer of oxide is deposited or grown across the face of a p-type substrate which includes a previously diffused or implanted heavily doped n-type (n+) region. The layer of oxide is then patterned and etched to open a window exposing the n-type doped region. The window is next filled with epitaxially grown n-type silicon (typically n−) to complete the formation of the collector. A p-type region is formed by diffusion or implantation into the face of the n-type "epi-fill" region and driven in under temperature to complete the base portion of the transistor. The emitter portion of the transistor can then be formed adjacent the base by either again using the "epi-fill" technique or by implantation or diffusion.

The significant drawback to the "epi-fill" process is the problem of shorting along the interface formed between the oxide layer in which the window is opened and the epitaxially grown crystalline silicon filling the window. Specifically, these shorts occur because the lack of a strong chemical bond between the insulator (oxide) and the silicon allows dopants atoms to travel along the interface, such as during implantation or diffusion of adjacent doped regions and/or during the step of thermal drive in the dopants, thereby forming a conductive region electrically coupling one conductive layer with another. In the example of the vertical npn transistor discussed above, the implantation or diffusion and thermal drive in of the base may cause the p-type dopants to extend all the way along interface between the n-type "epi-fill" and the surrounding oxide causing a short (diode) to the heavily doped (n+) portion of the base.

One means of preventing dopants from traveling along the interfaces is to mask the interfaces off at the surface during subsequent implantation/ diffusion, such as with a patterned layer of oxide. The mask however leads to dimensioning problems because part of the "epi-fill" layer is lost for use in the creation of the active device since the mask must extend over a portion of the surface the "epi-fill" to insure that the adjacent interface is completely covered. This is in addition to the fact that to form such a mask, a number of process steps, including the deposition or growth of the oxide, the deposition and patterning of the photoresist, and the etching of the oxide are required to form the mask.

The use of the of the "epi-fill" process to produce very small semiconductor devices, including bipolar and Metal Oxide Semiconductor (MOS) transistors, has further been limited by problems with planarization. The growth of the crystalline silicon through the window and beyond the plane of the oxide layer leads to a topography which is unsuitable for the fabrication of small dimension devices. In particular, with a non-planar surface, consistent definition of structure boundaries using conventional photolithographic processes becomes increasingly difficult as the device size is reduced. The varying depth of field of non-planar surface causes focusing difficulties with the photolithographic equipment which results in inconsistent and blurred pattern boundary lines. This becomes critical with small devices layouts where tolerance for errors in the photolithography is minimal.

Thus, a need has arisen for devices and methods embodying epitaxial growth ("epi-fill") techniques not subject to the disadvantages of shorting along the silicon/oxide interface and non-planar topographies.

SUMMARY OF THE INVENTION

According to the invention, a semiconductor device is provided at the face of a substrate. A layer of insulator disposed adjacent to the face of the substrate includes a window disposed therethrough. A region of epitaxial semiconductor is disposed in the window and forms an interface with adjacent portions of the layer of insulator. A seal is provided at the interface of the region of epitaxial semiconductor and the layer of insulator.

BRIEF DESCRIPTION OF THE DRAWINGS

For a more complete understanding of the illustrated embodiments of the present invention, and the advantages thereof, reference is now made to the following descriptions, taken in conjunction with the accompanying drawings, in which.

DETAILED DESCRIPTION OF THE INVENTION

The preferred embodiment of the present invention and its advantages are best understood by referring to FIGS. 1-3 of the drawings, like numerals being used for like and corresponding parts of the various drawings.

Figure 1A:
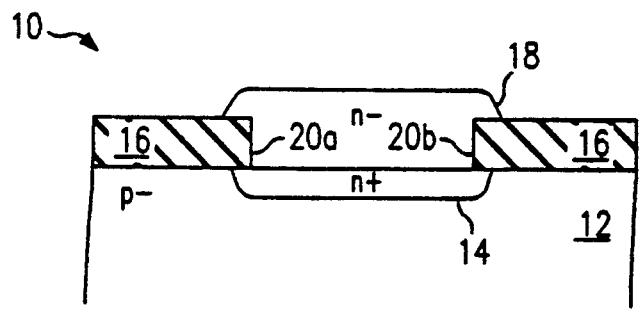
FIGS. 1a–1c are greatly enlarged schematic elevational sectional views of a semiconductor workpiece showing the fabrication of the collector and base regions of a vertical transistor according to the prior art.
Figure 1B:
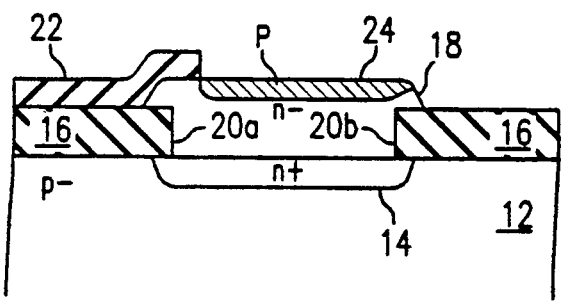
Figure 1C:
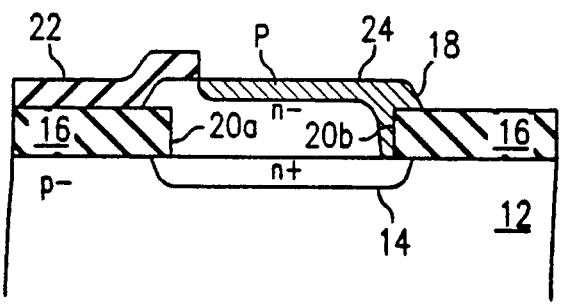

Referring first to FIGS. 1a-c, the fabrication of the collector and base portions of a vertical transistor 10 is depicted as an illustration of prior art semiconductor fabrication techniques using "epi-fill". Transistor 10 is formed at the face of a substrate 12, in the depicted example a layer of p-type semiconductor. A heavily doped n+ region 14 has been implanted or diffused into a portion of semiconductor layer 12. A layer of oxide 16 has been deposited across the surface of semiconductor layer 12 and a window opened there through to expose part of n+ region 14. A layer or region 18 of epitaxially grown n− semiconductor is disposed through L the window in oxide layer 16 to complete the n+/n− collector portion of transistor 10. Where oxide 16 and epitaxially grown doped layer 18 meet, an interface 20 is formed. At interface 20 no bond has been formed between the epitaxially grown region 18 and the oxide region 16.

In FIG. 1b, an oxide layer 22 has been deposited, patterned, and etched in order to mask off interface 20a. For illustration purposes, interface 20b has been left unmasked although in practice interface 20b would also be masked. It should be noted that the masking oxide layer 22, in order to sufficiently mask off interface 20a, has extended over a substantial area of epitaxially grown semiconductor 18 thereby reducing the area of region 18 which can be used for formation of the transistor base. Additionally, it should be recognized that the process of forming oxide layer 22 disadvantageously requires several additional steps including oxide deposition/growth, resist deposition, alignment and patterning, and etching. A doped region 24, p-type material in the example npn transistor 10, is diffused or implanted into the face of epitaxially grown semiconductor region 18. During either the process of diffusion or implantation, a number of dopant atoms may travel along unmasked interface 20b. Doped region 24 will become the base of transistor 10.

In the FIG. 1c, p-type region 24 has been thermally driven into n-type epitaxially grown layer 18. The step of driving typically would involve exposing the workpiece to a temperature of 1050° C. for approximately an hour. Following the step of driving in p-type layer 24, a short has developed along interface 20b. The dopant atoms themselves have been driven through the region at the interface 20b where bonds between the oxide layer 16 and the epitaxially grown layer 1B have not been established. Thus, while the problems inherent with the use of the mask 22 have been eliminated, the equally serious disadvantage of shorting down the interfaces 20 has occurred.

It should also be noted that in FIGS. 1a-1c epitaxially grown region 18 extends beyond the upper surface of the window through oxide layer 16. This extension of region 18 causes the surface of the workpiece to be nonplanar. Because a nonplanar surface will cause focusing difficulties with the photolithographic equipment used to pattern the face of the workpiece, the extension of region 18 through the window in oxide 16 presents a serious disadvantage when small structures are desired.

Referring next to FIGS. 2a-2g, the fabrication of a complementary metal oxide semiconductor (CMOS) inverter 26 illustrates the principles embodied in the present invention. The CMOS inverter has been chosen to illustrate the principles of the present embodiment since it shows fabrication of both p-channel and n-channel devices. It should be noted however, that while a pair of CMOS transistors, one a p-channel device and the other an n-channel device are used for illustration purposes in this example, the principles of the present invention can be used to fabricate any semiconductor device using regions of epitaxially grown semiconductor at the face of the substrate. For example, individual field effect transistors, diodes, or bipolar transistors may embody the present inventive principles. Additionally, it is also important to note that while in the present example only a single transistor is being formed in each region of epitaxially grown semiconductor, larger epitaxially grown regions or "tanks" may be formed across the face of the substrate each in which a number of devices may be created.

Figure 2A:
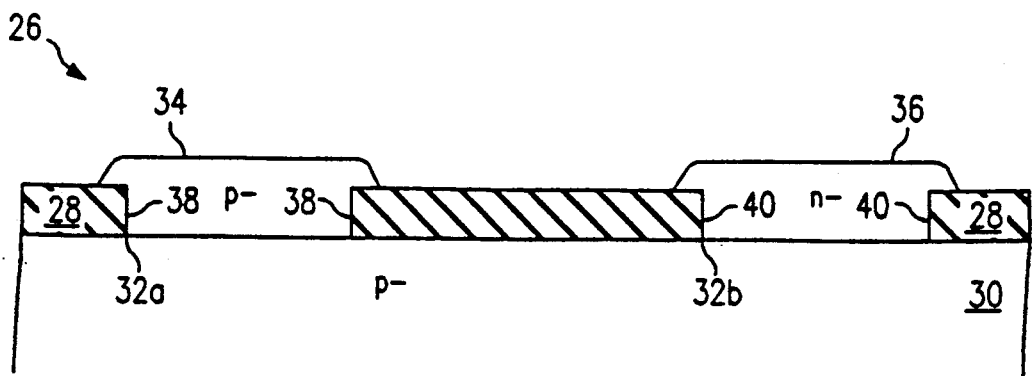
FIGS. 2a–2e are a series of greatly enlarged schematic elevational sectional views showing the fabrication of pair of field effect transistors according to the principals of the present invention.

Referring to FIG. 2a, a layer 28 of oxide is grown or deposited across the surface of a p− layer of semiconductor 30. Oxide layer 28 is patterned and etched to open windows 32a and 32b. Next p− region 34 and n− region 36 (the "tanks") are formed to have a dopant Concentration in the range of $10^{15}$ to $10^{18}$ cm$^{-2}$. This step may be performed by epitaxially growing p-type material into both windows 32a and 32b and then masking off window 32a and performing a counter doping implant into window 32b to form n-type tank. In alternate embodiments, n-type material may be epitaxially grown into both windows 32a and 32b, window 32b then masked and a counter doping implant performed into window 32a to form the required p-type tank. Similarly, both windows may be filled with epitaxially grown near intrinsic semiconductor and then appropriate implants performed into both windows. An interface 38 is formed between epitaxially grown p− region 34 and the portions of oxide layer 28 forming the sides of window 32a. An interface 40 is formed between n− epitaxially grown semiconductor layer 36 and the portions of oxide layer 28 forming the sides of window 32b.

Figure 2B:
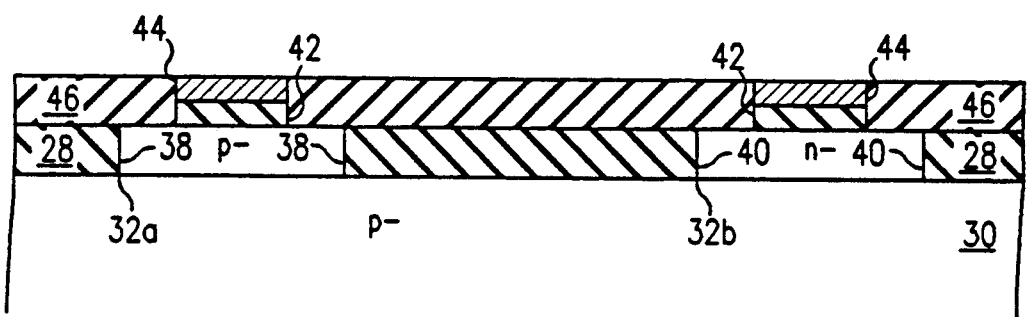

In FIG. 2b, interfaces 38 and 40 are sealed by seals 39 and 41. In the preferred embodiment, the seals 39 and 41 at interfaces 38 and 40 are provided by forming "densified" oxide regions at each interface. Thermal oxide is grown at each interface 38 and 40 by subjecting interfaces 38 and 40 to steam at about 750° C. for approximately 1 hour. The steam allows oxygen to react with the silicon in doped regions 34 and 36, the oxygen satisfying unfilled silicon bonds. The denser thermally grown oxide, which bonds to the silicon along interfaces 38 and 40 to form SiO$_2$, creates the "seals" which will prevent dopant atoms from traveling along at the interface. The face of the workpiece is next planarized using chemical/ mechanical grinding/ polishing using a slurry preferably composed of potassium hydroxide (KOH), silica and water.

Following sealing and planarization of interfaces 38 and 40, gate oxide layers 42 and conductive gates 44 are formed by conventional methods. Preferably, gates 44 are formed of doped (typically n-type) polycrystalline silicon. Next, a second oxide layer 46 is deposited across the surface of the workpiece. The interfaces between the polycrystalline silicon gate 44 and the oxide layer 46 are then sealed using the thermal oxide growth step discussed above. The entire face of the workpiece is again planarized using mechanical-chemical planarization techniques. During this planarization, any oxide deposited across the upper surfaces of gates 44 is removed.

Figure 2C:
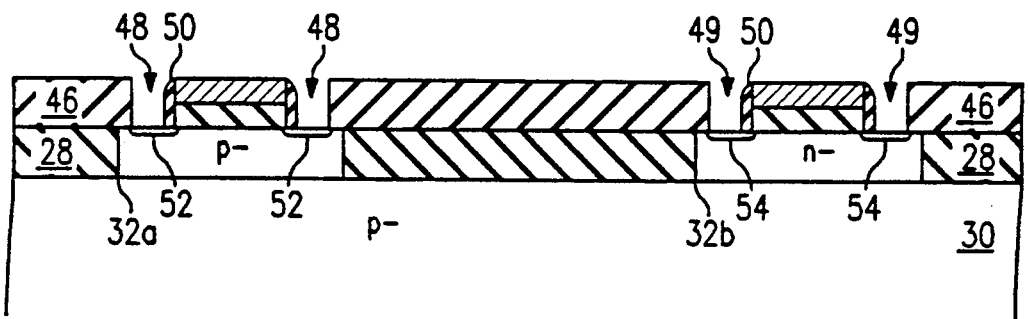

In FIG. 2c, windows 48 and 49 have been opened through oxide layer 46 to expose respective source/drain regions of epitaxially grown doped regions 34 and 36. Sidewall oxides 50 are next formed along the edges of gate 44 using a conventional sidewall oxide deposition and etching process. Optionally, n-type source/drain regions 52 may be formed through windows 48 into p− region 34 by implantation (preferably to be n+ having a dopant concentration in excess of $10^{19}$ cm$^{-3}$) prior to the formation of sidewall oxides 50. Similarly, p-type source/drain implants 54 may optionally be implanted (preferably to be p+ having a dopant concentration in excess of $10^{19}$ cm$^{-3}$) through windows 49 exposing portions of n− epitaxially grown region 36. It is important to note that for the formation of very small transistors (those having a total gate length of less than 0.6 μm) the implants be very shallow for reduced short channel effects. Shallow implants 52 and 54 increase the breakdown voltage between the respective source/drains of each transistor thereby allowing the intervening channel to be very short. Implanted regions 52 and 54 may also be optionally driven into epitaxially grown doped regions 34 and 36 respectively. Since interfaces 38 and 40 have been sealed, the danger of shorting to substrate 30 during the formation/ drive of source/drain implants 52 and 54 has been eliminated. Further, because interfaces 38 and 40 have been sealed, the risks of dopant atoms traveling along interfaces 38 and 40 when the workpiece is subjected to heat during subsequent fabrication steps has also been eliminated.

Figure 2D:
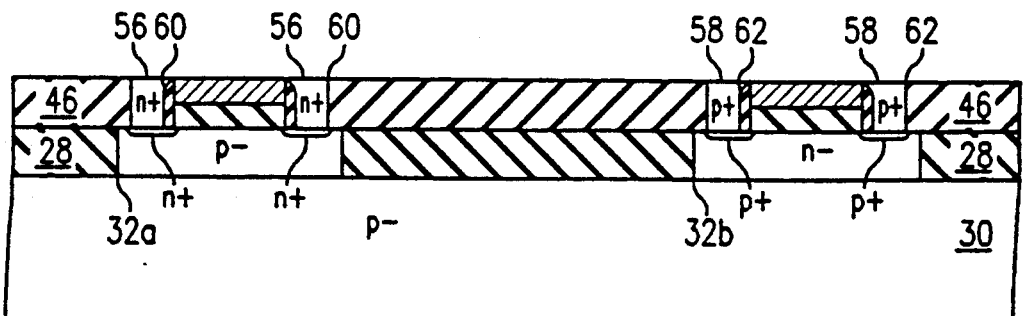

In FIG. 2d, raised source/drain regions 56 and 58 have been formed by the epitaxial growth of near intrinsic semiconductor, subsequently source/drain regions 56 are rendered n-type and source/drain regions 58 are rendered p-type. Interface 60 between n-type raised source/drain regions 56 and the surrounding oxides (portions of oxide layer 46 and sidewall oxide 50) are sealed using the thermal oxide growth technique discussed above. Similarly, the interfaces 62 between p-type raised source/drain regions 58 and the surrounding oxide regions are simultaneously sealed with densified (thermal) oxide. The surface of the workpiece is again planarized using chemical-mechanical planarization. The workpiece is then masked and respective implants of n-type (typically arsenic or phosphorous) and p-type (typically boron) dopants implanted into epitaxially grown regions 56 and 58, respectively. The implants result in n+ source/drain regions 56 and p+ source/drain regions 58 each typically having a dopant concentration in excess of $10^{19}$ cm$^{-3}$.

Figure 2E:
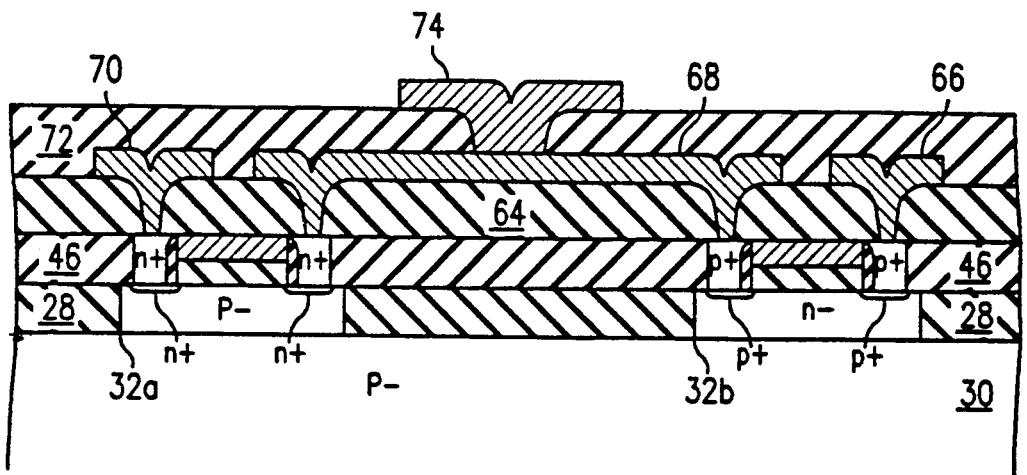

In FIG. 2e, typical interconnections are made to form a CMOS inverter from the n-channel and p-channel complimentary transistors fabricated in the illustrated embodiment. A interlevel layer 64 which may be interlevel oxide or doped glass (phosphosilicate glass or borophosphosilicate glass) has been formed across the surface of the workpiece and patterned and etched to open contacts to source/drain regions 56 and 58. A first level of metal, which may be an aluminum/silicon, titanium/tungsten or aluminum/copper mixture, is then formed across the face of the workpiece and patterned and etched. In the example inverter configuration, metal contact 66 couples a selected one of the source/drain regions 58 of the p-channel transistor to a voltage $V_{dd}$. Metal 68 line couples the remaining source/drain region 58 of the p-channel transistor to a selected one of the source/drain regions 56 of the n-channel transistor. Metal line 70 then couples the remaining source/drain region 56 of the n-channel transistor to a voltage $V_{ss}$, typically zero volts or ground.

After the formation, patterning, and etching of the first level of metal, a second layer 72 of mid-level insulator is formed across the face of the workpiece. Mid-level insulator 72 may be, for example, an interlevel oxide layer and can be planarized with chemical/mechanical polishing as previously described. Mid-level insulator 72 is then patterned and etched in the CMOS inverter configuration to open a contact window to metal contact 68. A second level of metal is then formed across the workpiece, patterned, and etched to provide a metal line 74 for the inverter output. The second level of metal may be, for example, aluminum/silicon, titanium/tungsten, or aluminum/copper.

The inputs to the inverters shown in the illustrated example are provided by the gates 44 of the n-channel and p-channel transistors which may be coupled together and tied to the input signal source. The gates 44 may be coupled together by a contact (not shown) or may be formed as an integral layer of polysilicon during the patterning of the polysilicon. (see FIG. 2g)

Figure 2F:
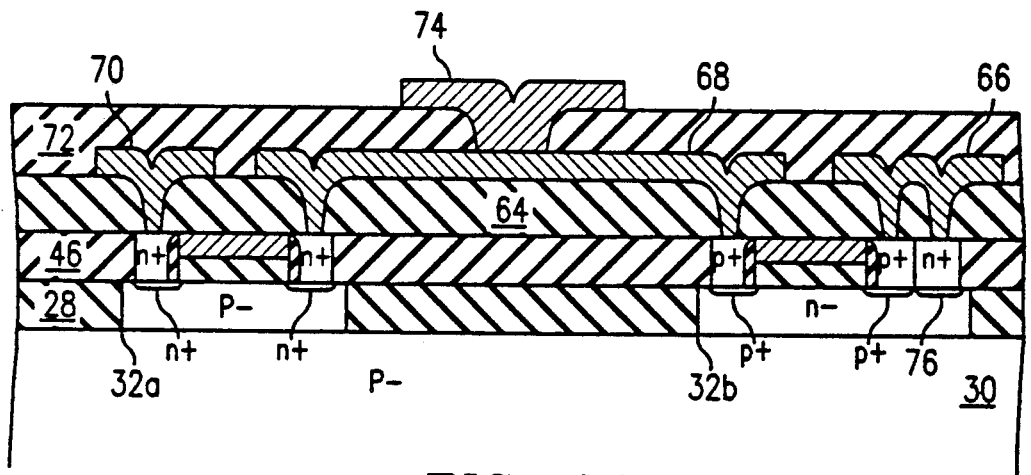
FIG. 2f is a greatly enlarged schematic elevational sectional view of an alternate embodiment of the transistors shown in FIG. 2e.

FIG. 2f shows a second embodiment of the inverter structure depicted in FIG. 2e. In this embodiment, a tank contact 76 has been formed to epitaxially grown n-type region 36. The raised source contact 76 may be formed using the epitaxial growth and implantation techniques discussed above in regards to source/drain regions 56 and 58, with a thermal seal provided between n-type contact 76 and adjacent portions of oxide layer 46. Tank contact 76 may also include a shallow n+ implantation into n-type region 36. In the illustrated example of a CMOS inverter, the tank contact is coupled to the adjacent p-type source/drain region 58, with both in turn coupled to voltage $V_{dd}$.

Due to the planarization of each of the layers and the sealing of the oxide/silicon interfaces, a very small semiconductor device (substantially less than 1 μm) can be produced according to the preferred embodiments of the present invention. The planarized layers allow for photolithographic definition of very small device structures with minimum focusing problems. Further, by sealing the silicon/oxide interfaces, shorting due to dopant atom travel along the oxide/silicon interfaces is eliminated. This allows regions or tanks of epitaxially grown doped silicon to be fabricated on the surface of the substrate in which a number of active devices can be created. Further, the sealing provides for epitaxially grown raised source/drain regions which in turn allows for the very short channel regions necessary for very small transistors. As previously noted, a number of tanks of a selected conductivity type can be grown across the face of the workpiece with each epitaxially grown region or tank supporting one or more CMOS active devices.

Figure 2G:
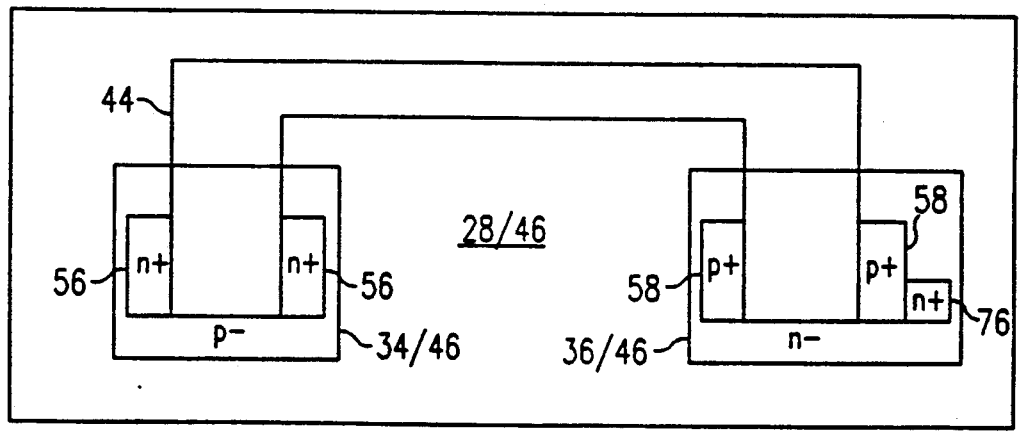
FIG. 2g is a plan view of the field effect transistors shown in the FIG. 2f.

FIG. 2g is a top plan view of portions of the inverter shown in FIG. 2f. Selected structures, such as the mid-level insulators 64 and 72 and the metal contacts 66–70 and 74 have been removed for clarity. In this example configuration, gates 44 are formed as an integral layer of doped polysilicon to provide the common input to the inverter 26.

Figure 3A:
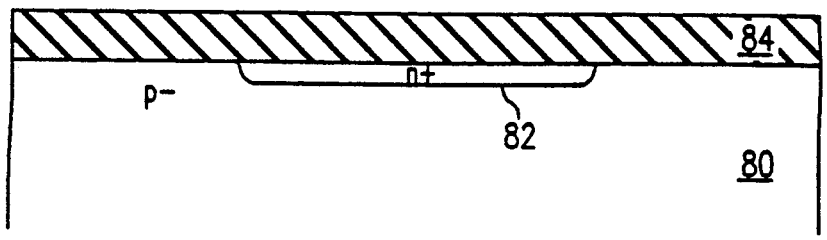
FIGS. 3a–3g are a series of greatly enlarged schematic elevational sectional views illustrating the fabrication of a bipolar transistor according to the principals of the present invention.

Referring next to FIGS. 3a–3f, the principles of the present invention are illustrated for the fabrication of a npn bipolar transistor 78. In FIG. 3a, the fabrication of transistor 78 is initiated at the face of a p− layer or substrate 80. The surface of layer 80 is patterned, an n+ implant performed, followed by diffusion at temperature, to form an n+ region or "buried layer" 82. The implantation and diffusion of n+region 82 is followed by the deposition of a layer 84 of oxide across the face of the workpiece.

Figure 3B:
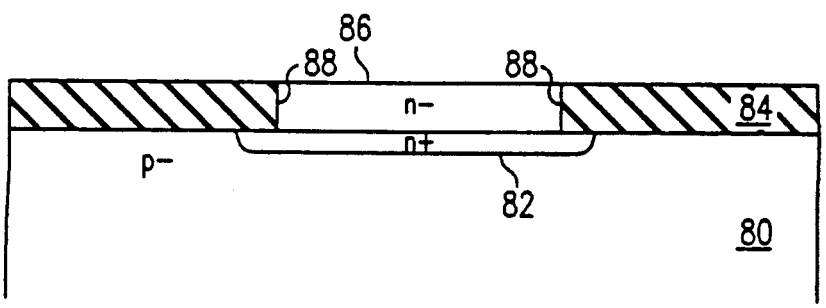

In FIG. 3b, oxide layer 84 is patterned and etched to expose a portion of buried layer 82. The opening through oxide layer 84 is then filled with epitaxially grown n− semiconductor region 86. Along the interfaces 88 where the epitaxially grown silicon region 86 meets adjacent portions of oxide layer 84, a densified (thermal) oxide seal is formed using the process discussed above. The face of the workpiece is then planarized using the mechanical/chemical planarization techniques, also discussed above.

Figure 3C:
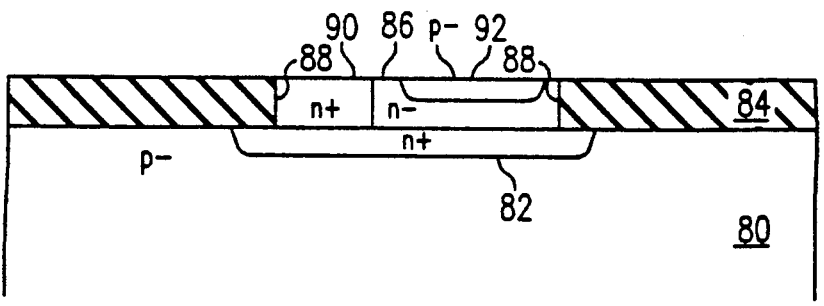

In FIG. 3c, the workpiece is then masked and an implant performed to define deep collector (n+) region 90. This implant is preferably an implantation of phosphorus. Deep collector region 90 provides a low resistance ohmic contact to the collector portion of transistor 78. Next, the face of the workpiece is again masked and an implant performed, preferably of boron, to form intrinsic p− base region 92.

Figure 3D:
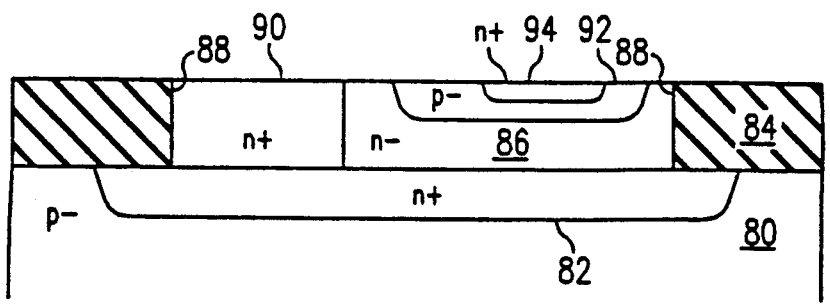

In FIG. 3d, n+ emitter region 94 is formed within intrinsic base region 92. In this embodiment, emitter 94 is formed by masking the face of the workpiece and performing an implant, preferably with arsenic.

Figure 3E:
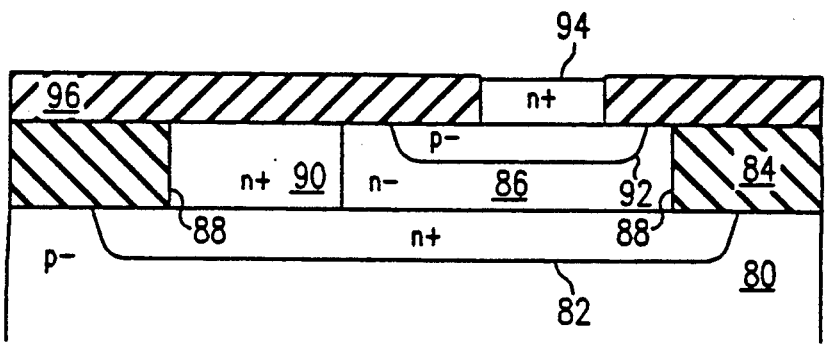

FIG. 3e depicts a second method of forming the emitter 94 of transistor 78. In this instance, an oxide layer 96 has been deposited or grown across the surface of the workpiece. Oxide layer 96 is next patterned and etched opening a window to expose a portion of base region 92. The window in oxide region 96 is then filled with epitaxially grown n− semiconductor. Next, the surface of the workpiece is planarized by mechanical-chemical grinding/polishing. The n− epitaxially grown semiconductor is then implanted, preferably with arsenic, to complete the n+ emitter region 94.

Figure 3F:
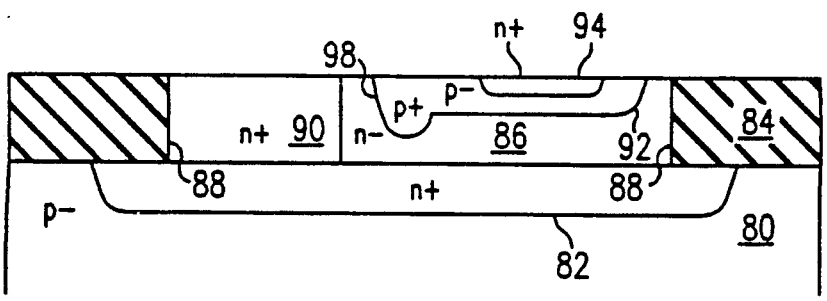
Figure 3G:
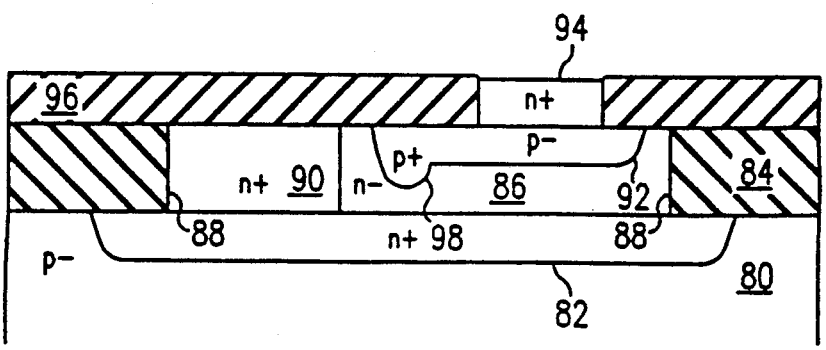

In FIG. 3f, an extrinsic portion 98 of base 92 (for the device shown in FIG. 3d) is formed by patterning the surface of the workpiece and performing an additional implant of boron. An extrinsic base region 98 may also be fabricated for the structure shown in FIG. 3e, using the same process steps. The extrinsic base region 98 provides a good ohmic contact with metalization (not shown) coupling transistor 78 to other devices (not shown). The lighter doped intrinsic region 92 of the base of transistor 78 is much shallower such that the emitter collector distance is small thereby providing increased beta of transistor 78.

As with the case of the MOS device example previously discussed, the successive planarization steps during the fabrication of bipolar transistor 78 provide for the photolithographic definition of very small structures without blurring due to focusing problems. Further, the steps of sealing the interfaces between epitaxially grown silicon areas and the adjacent oxide regions eliminate problems of shorting due to dopant atom transport along the interface between expitaxially grown semiconductor regions and adjacent oxide areas.

Although the present invention and its advantages have been described in detail, it should be understood that various changes, substitutions and alterations can be made herein without departing from the spirit and scope of the invention as defined by the appended claims.

What is claimed is:

1. A method of fabricating a semiconductor device at a face of a semiconductor region comprising the steps of:

forming a layer of insulating material adjacent said face of said semiconductor region;
opening a window through said insulating layer;
epitaxially growing a region of semiconductor material within said window; and sealing the interface in the window between the region of epitaxially grown semiconductor material and adjacent portions of the layer of insulating material thereby forming a densified insulating region at said interface.

2. The method of claim 1 wherein said step of forming a layer of an insulating material comprises the step of forming an oxide layer.

3. The method of claim 2 wherein said step of sealing comprises the step of forming a region of densified oxide along the interface between the region of epitaxially grown semiconductor material and the adjacent portions of the layer of oxide in the window.

4. The method of claim 3 wherein said step of forming a region of densified oxide comprises the step of exposing the interface to steam to form a region of thermal oxide.

5. The method of claim 1 and further comprising the step of forming a second layer of semiconductor material adjacent the region of epitaxially grown semiconductor material.

6. The method of claim 1 and further comprising the step of planarizing the face of the region of epitaxially grown semiconductor material after said step of sealing.

7. The method of claim 6 and further comprising the step of forming a second layer of semiconductor material adjacent the interface following said steps of sealing and planarizing.

8. The method of claim 4 wherein said step of exposing the interface to steam comprises subjecting said interfaces to steam at about 750° C. for approximately one hour.

9. The method of claim 2 wherein said semiconductor material comprises silicon and said step of sealing the interface comprises the step of reacting oxygen with silicon such that said oxygen satisfies unfilled silicon bonds at said interface.

10. The method of claim 9 wherein said step of sealing said interface prevents dopant atoms from traveling along at the said interface.

11. The method of claim 10 wherein said step of sealing comprises the step of exposing the interface to steam at temperature to form a region of thermal oxide with the epitaxially grown semiconductor material along the interface.

12. The method of claim 11 wherein said exposing step is performed at about 750° C. for approximately one hour.

13. A method of fabricating a transistor at the face of a semiconductor region comprising the steps of:

forming a first layer of oxide adjacent the face of the semiconductor region;
patterning and etching the first layer of oxide to define a first window therethrough;
epitaxially growing a region of semiconductor material of a first conductivity type within window in the first layer of oxide;
sealing the interface within the first window between the region of semiconductor material of the first conductivity type and the interface with the first layer of oxide with thermal oxide;
planarizing the face of the semiconductor device;

forming a layer of gate oxide adjacent the face of the region of epitaxially grown semiconductor material of the first conductivity type;

forming a layer of conductive polycrystalline silicon adjacent the layer of gate oxide;

patterning and etching the layer of polycrystalline silicon and the gate oxide to define a gate insulatively adjacent a channel area of the region of epitaxially grown semiconductor of the first conductivity type;

forming a second layer of oxide adjacent the face of the semiconductor device;

sealing a lateral interface between the layer of polysilicon and the second layer of oxide with thermal oxide;

planarizing the face of the semiconductor device;

patterning and etching the second layer of oxide to expose first and second source/drain area of the region of epitaxially grown semiconductor material of the first conductivity type, the first and second source/drain areas disposed laterally adjacent the gate conductor and underlying channel area of the region of epitaxially grown semiconductor material of the first conductivity type;

epitaxially forming first and second source/drain regions adjacent said first and second source/drain areas.

14. The method of claim 13 wherein said step of planarizing comprises the step of polishing and grinding using mechanical-chemical planarization.

15. The method of claim 14 wherein said step of polishing and grinding uses a slurry comprising potassium hydroxide, silica and water.

16. The method of claim 13 wherein said step of epitaxially forming first and second source/drain regions includes the substep of rendering the first and second source/drain regions conductive.

17. The method of claim 16 wherein the first and second source/drain regions are formed to be of a second conductivity type opposite the first conductivity type.

18. The method of claim 16 and wherein said of rendering conductive includes the step of performing an implant of the second conductivity type into the first and second epitaxially grown source/drain regions to increase the dopant concentration thereof.

19. The method of claim 13 wherein said sealing step comprises forming a densified oxide region along the interface.

20. The method of claim 13 wherein said semiconductor material comprises silicon and said step of sealing the interface comprises the step of reacting oxygen with silicon such that said oxygen satisfies unfilled silicon bonds at said interface.

21. A method of forming a semiconductor device comprising the steps of:

providing a semiconductor layer;

forming a buried doped region in a top surface of said semiconductor layer;

forming an insulating layer on said semiconductor layer;

removing a portion of said insulating layer to expose a portion of said buried doped region;

epitaxially growing a region of semiconductor material over said exposed portion of said buried doped region such that an interface is formed between said epitaxial region and said insulating layer; and sealing said interface between said epitaxial layer and said insulating thereby forming a densified insulating region at said interface.

22. The method of claim 21 and further comprising the step of planarizing the face of said semiconductor device.

23. The method of claim 22 and further comprising the steps of:

forming a deep collector region in said epitaxial region;

forming a base region in a top surface of said epitaxial region; and forming an emitter region adjacent said base region.

24. The method of claim 23 wherein said emitter region is formed within said base region.

25. The method of claim 24 wherein said emitter region is formed in a semiconductor layer formed above said base region.

26. The method of claim 23 and further comprising the step of forming an extrinsic base region within said epitaxial region adjacent said base region.

27. The method of claim 21 wherein said semiconductor region comprises silicon and said insulating layer comprises an oxide layer.

28. The method of claim 27 wherein said sealing step comprises the step of forming a densified oxide along said interface.

29. The method of claim 28 wherein said sealing step comprises the step of exposing the interface to steam to form a region of thermal oxide.

30. The method of claim 29 wherein said exposing step is performed at about 750° C. for approximately one hour.

31. The method of claim 29 wherein said sealing step comprises the step of reacting oxygen with silicon such that said oxygen satisfies unfilled silicon bonds at said interface.

32. The method of claim 22 wherein said planarizing step is performed using mechanical/chemical planarization techniques.

33. The method of claim 32 wherein planarizing step uses a slurry.

34. The method of claim 33 wherein said slurry comprises potassium hydroxide, silica and water.

35. The method of claim 21 wherein said semiconductor material comprises silicon and said step of sealing the interface comprises the step of reacting oxygen with silicon such that said oxygen satisfies unfilled silicon bonds at said interface.

* * * * *